(12) United States Patent
Lorch et al.

(10) Patent No.: US 10,599,520 B2
(45) Date of Patent: Mar. 24, 2020

(54) META-COPYSETS FOR FAULT-TOLERANT DATA STORAGE

(71) Applicant: Microsoft Technology Licensing, LLC, Redmond, WA (US)

(72) Inventors: Jacob Rubin Lorch, Bellevue, WA (US); Cheng Huang, Bellevue, WA (US); Peng Huang, Baltimore, MD (US); Aaron W. Ogus, Woodinville, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 91 days.

(21) Appl. No.: 15/989,589

(22) Filed: May 25, 2018

(65) Prior Publication Data

US 2019/0361775 A1 Nov. 28, 2019

(51) Int. Cl.
*G11C 29/00* (2006.01)
*G06F 11/10* (2006.01)
*H03M 13/15* (2006.01)

(52) U.S. Cl.
CPC ....... *G06F 11/1076* (2013.01); *H03M 13/154* (2013.01)

(58) Field of Classification Search
CPC ......... H04N 21/64723; H04N 7/17318; H04N 21/2187; H04N 21/234363; H04N 21/2347; H04N 21/8549; H04N 21/41407; H04N 21/4758; H04N 21/6131; H04N 21/84; H04N 21/2221; H04N 7/165; H04N 21/235; H04N 21/23106; H04N 21/2355;
(Continued)

(56) References Cited

U.S. PATENT DOCUMENTS 10,073,625 B2 * 9/2018 Guyot ................... G06F 3/0608
10,289,326 B2 * 5/2019 Dunn .................... G06F 3/0625
(Continued)

OTHER PUBLICATIONS

Cidon, Asaf et al., "Copysets: Reducing the Frequency of Data Loss in Cloud Storage" 2013 USENIX Annual Technical Conference (USENIX ATC '13), USENIX Association, 2013, (pp. 37-48, 12 total pages).
(Continued)

*Primary Examiner* — Guerrier Merant
(74) *Attorney, Agent, or Firm* — Buckley, Maschoff & Talwalkar LLC (57) ABSTRACT

A system includes determination of a plurality of meta-copysets of a plurality of storage devices, each of the meta-copysets including a first number of storage devices, determination of a first copyset of a second number of storage devices from a first one of the meta-copysets, where the second number is less than the first number, storage of first data in a fault-tolerant format using the first copyset, determination to migrate the first data from a first storage device of the first copyset, and, in response to the determination to migrate the first data, determine a second copyset of the second number of storage devices including a storage device from the first meta-copyset which is not in the first copyset, and the storage devices of the first copyset except for the first storage device of the first copyset and storage of the first data in a fault-tolerant format using the second copyset.

20 Claims, 6 Drawing Sheets

(58) Field of Classification Search
CPC .......... H04N 21/2381; H04N 21/2402; H04N 21/25833; H04N 21/26216; H04N 21/26266; H04N 21/2668; H04N 21/845; H04N 21/8545; G06F 11/10; G06F 11/1076; G06F 3/067; G06F 11/2094; G06F 3/0611; G06F 3/0631; G06F 3/065; G06F 3/0619; G06F 2201/805; G06F 3/0625; G06F 3/064; G06F 3/0683; G06F 3/0608; G06F 11/00; G06F 3/0653; G06F 11/3409; G06F 11/3062; G06F 3/0689; G06F 11/3485; G06F 11/3034; G06F 11/16; G06F 2201/81; G06F 1/3203; H03M 13/154; Y02D 10/154; G11B 19/26; G11B 19/28; G11B 19/2072
See application file for complete search history.

(56) References Cited

U.S. PATENT DOCUMENTS

2017/0147458 A1   5/2017  Epstein et al.
2017/0277610 A1   9/2017  Ivanichkina et al.

OTHER PUBLICATIONS

"International Search Report and Written Opinion Issued in PCT Application No. PCT/US19/031917", dated Jul. 29, 2019, 11 Pages.

* cited by examiner

META-COPYSETS FOR FAULT-TOLERANT DATA STORAGE

BACKGROUND

A copyset is a set of machines used to store replicas of a same chunk of data. At least one copy of the data chunk will always be available so long as at least one machine of the copyset remains available. Current storage systems assign each stored data chunk to a random copyset. Consequently, if a certain number of machines become simultaneously unavailable, it is likely that all the machines of at least one copyset will be unavailable, and therefore the data chunks stored on that copyset will be unavailable.

It has been observed that limiting the number of copysets in use can reduce the probability that all machines of any one copyset become unavailable at any given time. Accordingly, in some systems, each data chunk is stored in one of the limited number of copysets instead of in a random copyset of machines. Due to the use of limited copysets, many data chunks will become unavailable if all machines of a copyset become unavailable. This consequence is considered acceptable as compared to the above-described systems, because the reduction in episodes of data unavailability typically outweighs the negligible increase in recovery costs in a case that a copyset becomes unavailable.

When using limited copysets, it may be costly to migrate data off a single machine of a copyset. Such migration may be necessary if the machine becomes unavailable or nears its storage capacity. However, the option to migrate data off a single machine to another machine within the same copyset is not usually available.

Storage using limited copysets also assumes replication of data chunks across members of the copyset. Some storage systems implement erasure coding in order to use storage more efficiently. Data may become unavailable in such systems whenever several machines are unavailable at the same time. Specifically, a data chunk is unavailable if all replicas of a data chunk are on stored on failed machines. A data chunk will also be unavailable if it is X+Y erasure-coded and machines storing Y+1 fragments are unavailable.

Systems are desired to address the shortcomings of limited copysets and to support the storage of erasure-coded data.

DETAILED DESCRIPTION

The following description is provided to enable any person in the art to make and use the described embodiments. Various modifications, however, will remain readily-apparent to those in the art.

Some embodiments address the foregoing through the use of meta-copysets. A meta-copyset is a set of machines from which one or more copysets are generated. For example, in a system implementation providing three-way data replication, copysets of three machines (i.e., of size 3) may be defined from meta-copysets of size 5. As described above, a particular data chunk may be stored only in a defined copyset of machines. Assuming two meta-copysets ABCDE and ABFGH, examples of valid copysets which may be used to store data include ABC, ABD, and BGH, but not CDH.

Consequently, it is typically possible to migrate data from one machine to another machine while conforming to the limited set of copysets. Furthermore, while the use of meta-copysets significantly increases the number of storage-eligible copysets, the risk of data unavailability is not significantly increased, due to the re-use of machines (and resulting high failure correlation) among copysets in a same meta-copyset.

Data migration may be desirable for various reasons, the primary of which are failure recovery and storage load balancing. In the first scenario, the anticipated long-term failure of a machine necessitates the reconstruction of its data on other machines. In the second scenario, a machine is identified as reaching its storage capacity while one or more other machines are identified as having more free storage capacity, and it is therefore desirable to move data from the former machine to the latter machine(s).

Unlike traditional copyset-based systems, some embodiments provide efficient migration of data for every machine in a copyset such that all migrated data chunks remain on valid copysets. Embodiments may be used for replication-based fault-tolerance as well as for erasure-coded storage implementations, which will be described in more detail below.

Figure 1:
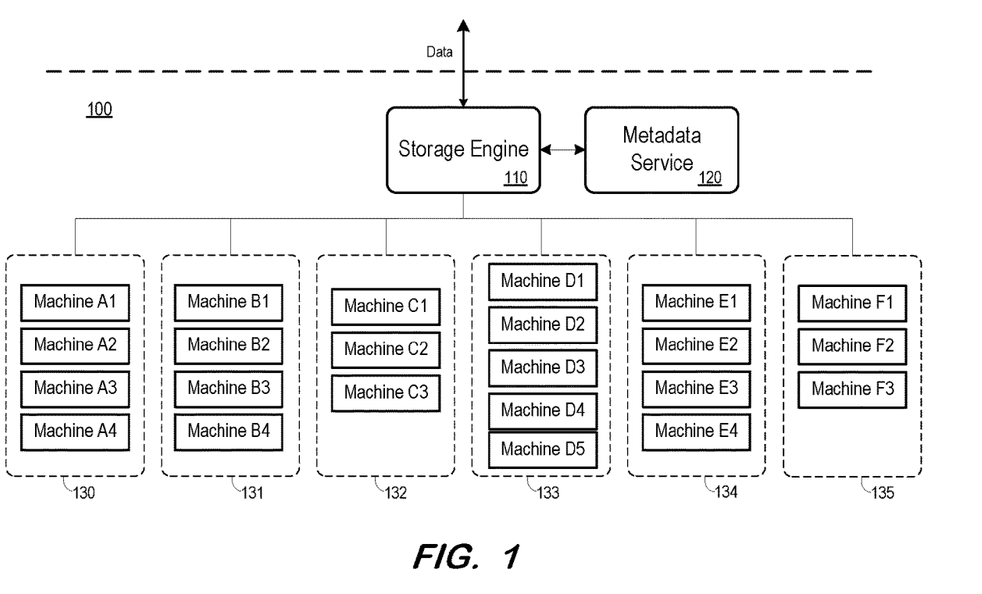
FIG. 1 illustrates a storage architecture according to some embodiments.

FIG. 1 illustrates storage architecture 100 according to some embodiments. Storage architecture 100 may store any type of data from any source. Storage architecture 100 may implement an on-premise data storage system, a cloud-based storage service, a hybrid storage system, and/or any other type of data storage system in any deployment that is or becomes known. Storage architecture 100 is intended to store data in a fault-tolerant manner according to some embodiments.

Storage architecture 100 includes storage engine 110. Storage engine 110 will be described herein as controlling the reception and storage of incoming data, and the providing of data in response to requests therefore. Storage engine 110 operates in conjunction with metadata service 120 according to some embodiments. Metadata service 120 may define meta-copysets, determine copysets from the meta-copysets and assign data chunks thereto, and determine and re-assign copysets to data chunks to assist data migration.

Data chunks stored within copysets may comprise any identifiable unit of data according to some embodiments. For example, a data chunk may comprise an extent, which is a collection of eight physically contiguous 8 KB pages. In some embodiments, a page begins with a 96-byte header which stores the page number, page type, the amount of free space on the page, and an allocation unit ID of the object that owns the page. In X-way replication-based storage, each copyset consist of X machines and an extent is copied in its entirety to each of the X machines of the copyset to which it is assigned.

According to some embodiments, the data chunks may comprise fragments resulting from erasure-based encoding. According to erasure-based encoding, data to be stored (e.g., an extent) is split into X (e.g., 6) equal-sized data fragments. Coding is applied to the data fragments to generate Y (e.g., 3) parity fragments, each of which is the same size as the data fragments. By virtue of the encoding scheme, the original data may be reconstructed from any X (i.e., 6) of these X+Y (i.e., 9) fragments. Fault-tolerance is achieved by storing the X+Y fragments among X+Y different machines, such that the data may be recovered even if Y of the machines fail. Moreover, this storage arrangement requires storage space equal to 1.5× of the size of the original data, as opposed to 3× in the case of replication.

Architecture 100 includes six failure domains 130 through 135. Each failure domain includes a number of machines. All machines within a failure domain are susceptible to simultaneously unavailability. Examples of failure domains include network racks, because each machine installed in a network rack is typically connected to a same power source and a same top-of-rack switch. Embodiments are not limited to machines which share respective failure domains. Some embodiments comprise a set of machines in which one, some or all of the machines do not share a failure domain with any other machine.

A machine as described herein may comprise any computing device or system in which data may be stored. According to some embodiments, a machine is a blade server and each failure domain is a network rack in which the blade servers are installed.

Each element depicted in architecture 100 may include any number of computing devices and any type of hardware or software for executing the functions ascribed thereto. Each element may be located adjacent to or remote from any one or more other elements, and the elements may communicate with one another using any number and type of intermediary computing networks. A storage architecture according to some embodiments may include may elements not depicted in FIG. 1.

Figure 2:
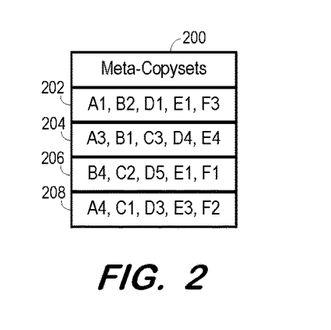
FIG. 2 is a tabular representation of meta-copysets of the FIG. 1 architecture according to some embodiments.

FIG. 2 is a tabular representation of metadata 200 of meta-copysets which have been defined based on the machines of architecture 100. The meta-copysets are determined and metadata 200 is maintained within storage architecture 100 by metadata service 120 according to some embodiments. The meta-copysets are determined based on one or more constraints. One constraint is a number of machines to be included within each meta-copyset.

The desired number of machines in a meta-copyset is based on the number of machines C in a copyset. The number of machines C is based, in turn, on the type of fault-tolerant data storage scheme to be used. In the case of three-way replication, C=3. In the case of 14+4 erasure-coding, C=18. According to some embodiments, the number of machines in a meta-copyset is C+2. Embodiments are not limited thereto, and may employ C+1, C+3, C+4, etc. machines in each copyset.

In some embodiments, the determination of meta-copysets is also constrained by rules associated with the nature of machines within the meta-copyset. For example, a rule may require that every machine in a meta-copyset is associated with a different failure domain.

FIG. 2 depicts four meta-copysets 202, 204, 206 and 208, but architecture 100 does not limit the number of meta-copysets thereto. As shown, each meta-copyset includes 5 machines (assuming C=3), and each machine of a meta-copyset belongs to a different failure domain. Moreover, no machine belongs to more than one meta-copyset.

Figure 3:
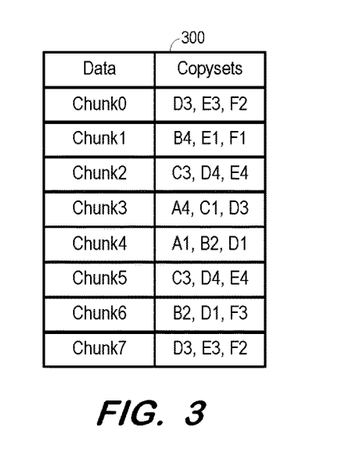
FIG. 3 is a tabular representation of a mapping of data to copysets according to some embodiments.

FIG. 3 is a tabular representation of metadata 300 associating data chunks with copysets according to some embodiments. Metadata service 120 may assign each data chunk to be stored to a copyset, which is in turn is determined from one of the meta-copysets defined in metadata 200. As shown, each determined copyset of metadata 300 includes machines from a single meta-copyset.

Metadata 300 includes copysets which, although not identical, are subsets of a same meta-copyset. For example, the copysets of Chunk0 and Chunk3 are each associated with meta-copyset 208, and the copysets of Chunk4 and Chunk6 are each associated with meta-copyset 202. Accordingly, the data chunks associated with these different copysets are associated with a same meta-copyset. Metadata 300 also assigns some data chunks (e.g., (Chunk2, Chunk5) and (Chunk0, Chunk7)) to a same copyset (e.g., (C3, D4, E4) and (D3, E3, F2)).

Generally, N meta-copysets results in N(C+1)(C+2)/2 possible copysets, as there are (C+1)(C+2)/2 ways to choose a size-C copyset out of a meta-copyset of size C+2. This increase in copysets versus a traditional copyset implementation results in only a modest increase in the probability of data-unavailability. The increase is modest because the copysets of a meta-copyset include common machines, so events which cause one copyset to be unavailable are likely to cause other copysets of the meta-copyset to be unavailable. Moreover, usage of meta-copysets as described herein may provide a large benefit—the ability to perform failure recovery and load balancing without massive data migration to an entirely new copyset.

Figure 4:
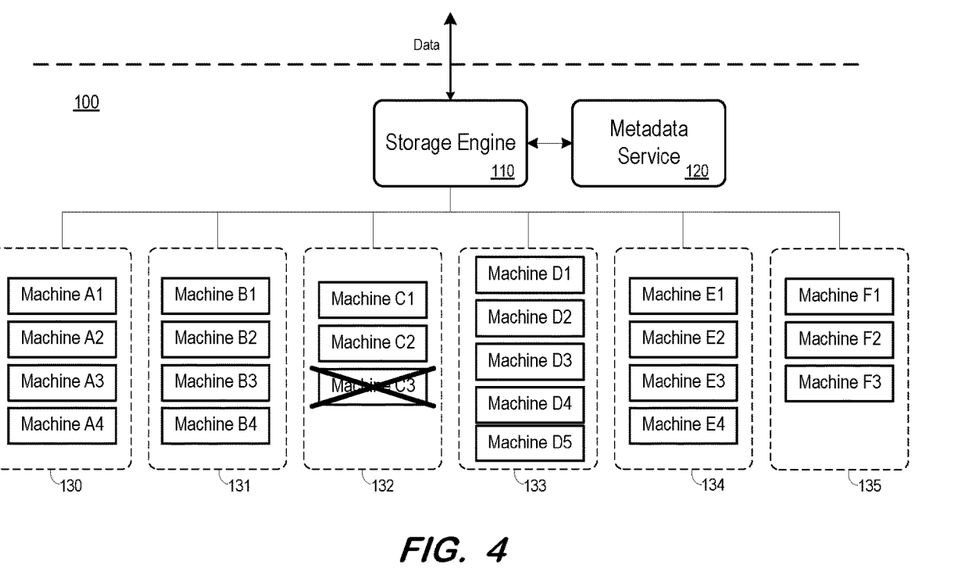
FIG. 4 illustrates a storage architecture including an unavailable machine according to some embodiments.
Figure 5:
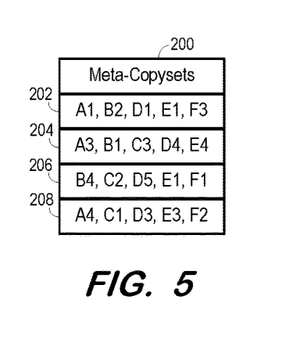
FIG. 5 is a tabular representation of meta-copysets of the FIG. 4 architecture according to some embodiments.
Figure 6:
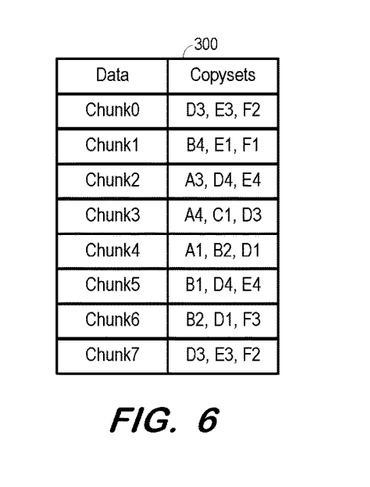
FIG. 6 is a tabular representation of a revised mapping of data to copysets according to some embodiments.

According to some embodiments, any copyset that is a subset of a meta-copyset is a valid copyset. As a result, data may be efficiently migrated from a machine without violating the copyset restriction. FIGS. 4 through 6 illustrate an example of data migration according to some embodiments.

As illustrated in FIG. 4, it is assumed that machine C3 of failure domain 132 has become unavailable. In some embodiments, this unavailability is detected by metadata service 120. In response, metadata service 120 determines to migrate the data chunks residing on copysets including machine C3 to another machine. As described herein, the other machine belongs to the same meta-copyset as machine C3. Because a meta-copyset may include many machines, the machine to which one data chunk stored on machine C3 is migrated may be different than the machine to which another data chunk stored on machine C3 is migrated.

Referring back to FIG. 3, Chunk2 and Chunk5 are each assigned to a copyset which includes machine C3. Accordingly, copies of Chunk2 and Chunk 5 reside on machine C3. Due to the unavailability of machine C3, Chunk2 and Chunk5 must each be copied to another machine in order to maintain the three-way replication of the present example.

As shown in metadata 300, Chunk2 and Chunk5 are each associated with a copyset consisting of machines C3, D4 and E4. Embodiments are not limited thereto, as each chunk may be associated with different copysets, each of which includes machine C3. According to some embodiments, the machines to which Chunk2 and Chunk5 are copied in response to the unavailability of machine C3 belong to a same meta-copyset as the copysets associated with Chunk2 and Chunk5 in metadata 300.

The copyset C3, D4 and E4 belongs to meta-copyset 204. An available machine is therefore selected from meta-copyset 204 to replace machine C3 in the copysets associated with Chunk2 and Chunk5. FIG. 6 illustrates metadata 300 as modified to reflect this replacement. In particular, machine A3 has replaced machine C3 in the copyset associated with Chunk2, and machine B1 has replaced machine C3 in the copyset associated with Chunk5. As shown in FIG. 5, both of replacement machines A3 and B1 belong to meta-copyset 204, thereby preserving the meta-copyset/copyset restriction described above.

Figure 7:
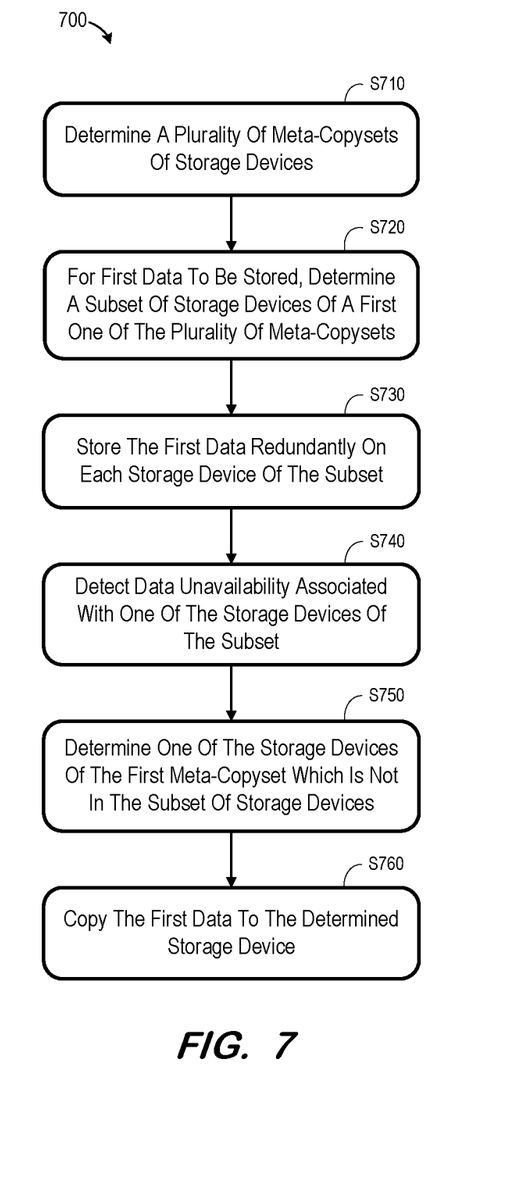
FIG. 7 is a flow diagram of a process to store data in copysets of meta-copysets according to some embodiments.

FIG. 7 comprises a flow diagram of process 700 to provide fault-tolerant data storage according to some embodiments. In some embodiments, processing units (e.g., one or more processors, processing cores, processor threads) of a data storage server execute software program code to cause the server to perform process 700. Execution of process 700 may be distributed among several data storage server nodes. Process 700 and all other processes mentioned herein may be embodied in processor-executable program code read from one or more of non-transitory computer-readable media, such as a floppy disk, a CD-ROM, a DVD-ROM, a Flash drive, and a magnetic tape, and then stored in a compressed, uncompiled and/or encrypted format. In some embodiments, hard-wired circuitry may be used in place of, or in combination with, program code for implementation of processes according to some embodiments. Embodiments are therefore not limited to any specific combination of hardware and software.

Initially, a plurality of meta-copysets are determined at S710. Each meta-copyset includes a number of storage device, referred to as machines above. As described above, The meta-copysets are determined at S710 based on one or more constraints. One constraint is the number of storage devices to be included within each meta-copyset. The number of storage devices in each determined meta-copyset is greater than the number of storage devices required for the particular fault-tolerant storage scheme in use. Another constraint may be the relative locations of the storage devices within a meta-copyset. According to one constraint, only a limited number (e.g., 0, 2) of storage devices in a meta-copyset may belong to a same failure domain.

A process to determine a plurality of meta-copysets will now be described. The process assumes that each copyset should include C storage devices and each meta-copyset should include C+2 storage devices. Also, each storage device is associated with a known failure domain (e.g., a rack) that is shared with one or more other storage devices.

The process begins by randomly permuting the racks. Next, the storage devices in each rack are randomly permuted. The permutations are merged into a list by sorting the storage devices into a list using primary sort key "position of device in the permutation of devices in the same rack" and secondary sort key "position of device's rack in the permutation of racks." The resulting list is split into groups of C+2 machines, where each group is a meta-copyset. The above steps may be repeated until the desired scatter width is achieved.

In this regard, the scatter width for a storage device M is the number of other devices that are in a same copyset as M. A high scatter width may be desirable because the scatter width is indicative of the number of storage devices which may be available to assist in the recovery or movement of M's data. In the case of meta-copysets, increased scatter width increases the number of devices from which to choose when data is to be moved off a machine.

The main way to raise scatter width is to use more meta-copysets. The more meta-copysets of which M is a part, the more other devices with which M will share a copyset. However, using too many meta-copysets is problematic, since an increase in the number of more meta-copysets increases the probability of data unavailability. One goal is to use enough meta-copysets to give each devices a reasonable scatter width, while assigning devices to meta-copysets in a way that results in as much scatter width as possible for a small number of meta-copysets. To achieve this, it is desirable to have little overlap between meta-copysets.

A reasonable target for scatter width S is Z/2, where Z is the number of devices on other racks. For instance, in an architecture of 20 racks with 16 devices per rack, Z would be 19*16. Accordingly, a device will share a meta-copyset with half of all devices in the cluster with which it could conceivably share a meta-copyset.

A repeat count R is the number of times to repeat the four steps to achieve the desired scatter width $$S = \frac{Z}{2}.$$

From the perspective of a single device, each time the four steps described above are repeated, C+1 devices are added to the set of devices with which it shares a meta-copyset. However, some of these devices were already in that set, so the scatter width is not necessarily increased by a full C+1. The process is essentially a sample-with-replacement from the Z devices. The formula for the expected number of distinct items when picking m of n items with replacement is $$n\left[1 - \left(\frac{n-1}{n}\right)^m\right].$$

So, the appropriate formula is $$S = Z\left[1 - \left(\frac{Z-1}{Z}\right)^{R(C+1)}\right].$$

In view of the constraint $$S = \frac{Z}{2}, R = \frac{1}{(C+1)[\log_2 Z - \log_2(Z-1)]}.$$

For example, if C=18 and Z=19*16, then R=11.

Flow proceeds to S720 once the devices of the plurality of meta-copysets are determined. Next, data to be stored is assigned to respective copysets within the meta-copysets. For example, for a first data chunk to be stored, a subset of storage devices of a first one of the meta-copysets is determined. The size of the subset is less than the size of the meta-copysets, and is determined by the type of fault-tolerant data storage scheme to be used. If three-way replication is to be used, then the subset includes three storage devices. If 6+3 erasure coding is used, then the subset includes nine storage devices.

At S730, the first data is stored redundantly on the subset of storage devices which was determined for the first data at S720. In the case of a replication-based storage system, a full copy of the first data is stored on each of three determined storage devices. If the storage system uses erasure coding, the first data is split into fragments, a number of additional fragments are generated from the original fragments, and each fragment is stored on a respective one of the determined storage devices.

S720 and S730 may be repeated for any number of data elements to be stored, resulting in metadata which associates each data element with a copyset, such as metadata 300 of FIGS. 3 and 6.

S740 through S760 may proceed as described above with respect to FIGS. 4 through 6. Specifically, metadata service 120 may detect unavailability of a storage device of the subset of storage devices of the first meta-copyset. In response, at S750 metadata service 120 determines a storage device of the first meta-copyset which is not in the subset of storage devices determined for the first data. The first data is then copied to the storage device determined at S750.

S740 through S760 may be repeated for other data stored on various subsets of storage devices which include the unavailable storage device. The storage devices to which the other data is migrated may differ as described with respect to FIG. 6.

Figure 8:
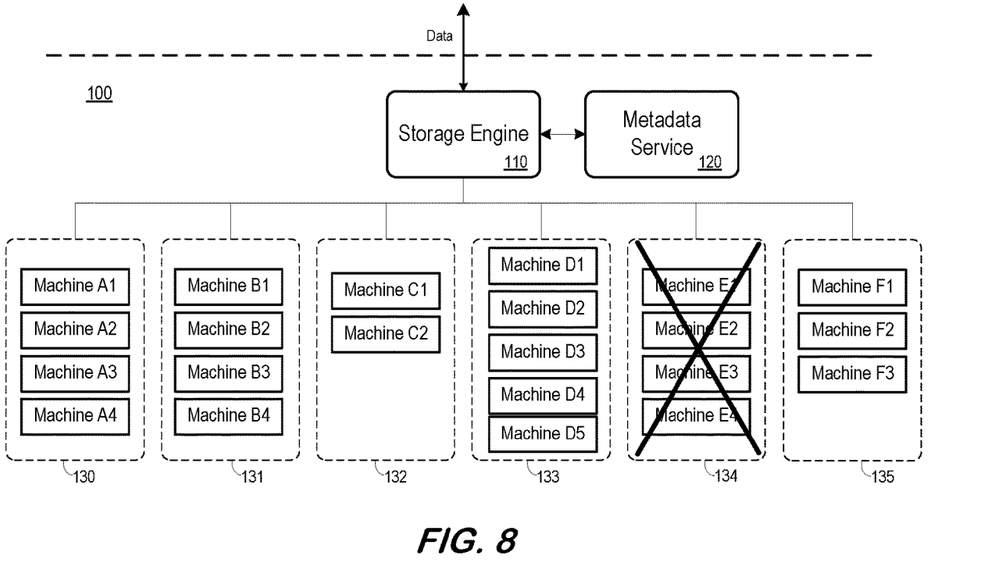
FIG. 8 illustrates a storage architecture including an unavailable failure domain according to some embodiments.
Figure 9:
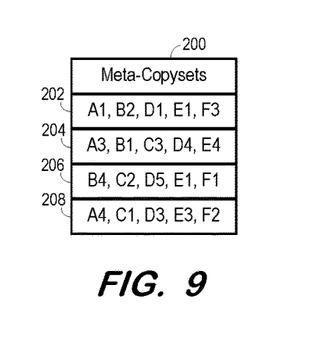
FIG. 9 is a tabular representation of meta-copysets of the FIG. 8 architecture according to some embodiments.
Figure 10:
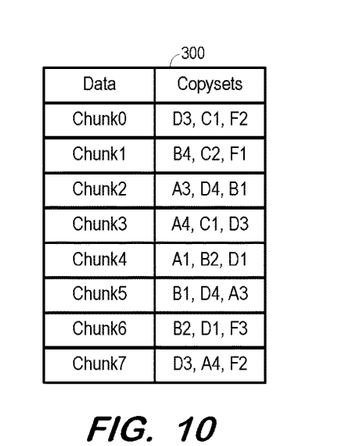
FIG. 10 is a tabular representation of a revised mapping of data to copysets according to some embodiments.

FIG. 8 illustrates a scenario in which all machines in a failure domain become unavailable. Upon detecting the unavailability, replacement machines are determined for copysets which include one of the unavailable machines. As shown in FIG. 10, and in comparison to the copysets of FIG. 6, each copyset including one of machines E1, E2, E3 or E4 has been updated to replace the unavailable machine with another, available, machine of a same meta-copyset.

An erasure-coding scheme may require more machines than there are racks in a cluster, such as in a case of 20+4+2 encoding in a cluster with only 20 racks. Accordingly, a meta-copyset may include machines located on a same rack. In such schemes, metadata may specify certain fragment pairs which are permitted to occupy machines in the same rack. However, it is desired to minimize the amount of rack re-use within a meta-copyset. The meta-copyset determination described above minimizes the number of machines that share a rack. For instance, if the meta-copyset size is 28, the determination will first assign 20 machines on 20 different racks to a meta-copyset, and then reuse 8 racks for the remaining 8 machines of the copy-set.

Figure 11:
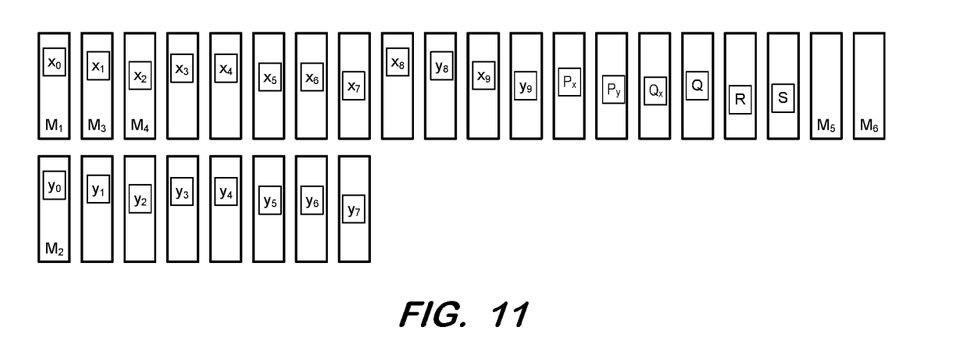
FIG. 11 illustrates the storage of erasure-coded fragments in a set of machine racks according to some embodiments.

To maintain the constraint of only allowing certain fragment pairs to be stored in machines of a same rack, in some cases moving one fragment due to machine unavailability will necessitate moving one or more additional fragments. For example, FIG. 11 illustrates storage of data including 26 fragments. FIG. 11 includes six machines named M1, M2, M3, M4, M5, M6, and 22 other machines. M1 and M2 are on the same rack, and M3, M4, M5, and M6 are on different racks. The 26 fragments are stored on all 28 machines except for M5 and M6.

Figure 12:
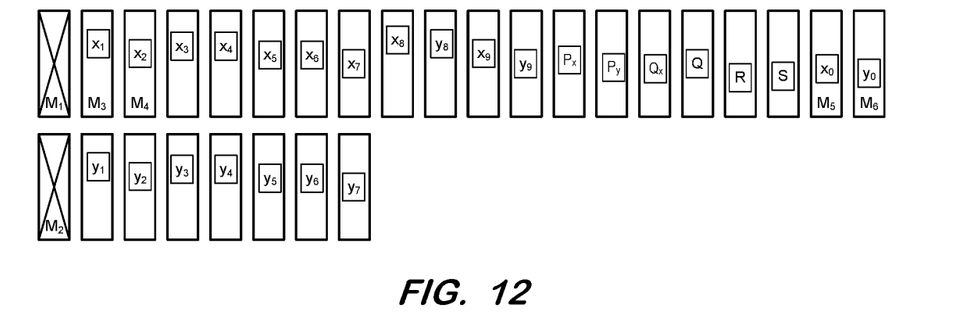
FIG. 12 illustrates the migration of erasure-coded fragments in a set of machine racks according to some embodiments.

It will be assumed that "x" and "y" fragments may be located on machines of a same rack, while two "x" fragments or two "y" fragments cannot be located on machines of a same rack. If both M1 and M2 fail at the same time, then fragment $x_0$ on M1 and fragment $y_0$ on M2 must be moved to other machines in the meta-copyset. FIG. 12 shows the completed migration of fragment $x_0$ and fragment $y_0$ to M5 and M6, the two spare machines of the meta-copyset.

Figure 13:
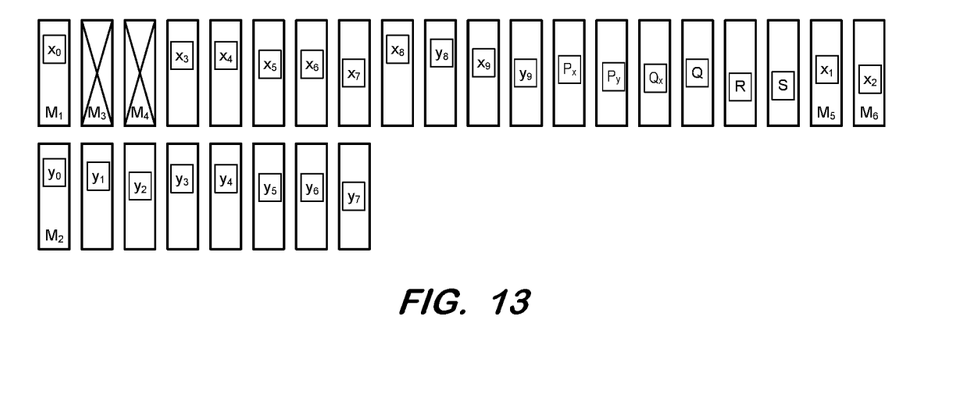
FIG. 13 illustrates the migration of erasure-coded fragments in a set of machine racks according to some embodiments.

It will now be assumed that M1 and M2 are eventually brought back online, then M3 and M4 fail. Fragment $x_1$ must be recreated from M3 and $x_2$ must be recreated from M4, and M1 and M2 are available but currently-unused. However, storage of $x_1$ and $x_2$ on M1 and M2 is not permitted because $x_1$ and $x_2$ are not meant to be rack-collocated. This can be addressed as shown in FIG. 13, by first moving $x_0$ from M5 to M1 and $y_0$ from M6 to M2, thereby making space for $x_1$ and $x_2$ on M5 and M6.

Certain events, e.g., a major thermal incursion, may cause many machines to become unavailable simultaneously, such that it is not possible to store new data on a valid copyset. Moreover, redundant pieces of existing data might not be movable to other machines of an associated meta-copyset. In response to such a situation, data may be stored in a random copyset.

As described above, the use of random copysets can lead to high rates of unavailability. Thus, a background process may be employed to identify data that are not stored in a valid copyset (i.e., a copyset in which all machines belong to a defined meta-copyset), and to migrate the data to a valid copyset. This background process may be assigned limited processing power and I/O bandwidth, to prevent it from usurping resources from more important jobs.

In some unavailability scenarios, the limited-copyset scheme presented herein can only be satisfied with significant data movement. For instance, a machine might fail in a way deemed to be long-term, necessitating the moving of its data to other machines. But, for one data chunk on that machine, the associated meta-copyset may include three unavailable machines. The limited-copyset scheme may be maintained by moving all the data's chunks to an entirely different meta-copyset. However, this may require undesirable amounts of time and bandwidth. Accordingly, when only one chunk requires migration, the chunk is migrated even if this migration would violate the meta-copyset constraint. The above-mentioned background process may be used to eventually address this violation as described above.

Responding to machine failures and data recovery may necessitate load balancing. Load balancing may also be necessary in the absence of failures/recovery. In this regard, a random selection of copysets will exhibit variance, and will therefore place more data on some machines than on others. Load balancing will become desirable as some machines approach capacity before others.

Load balancing is preferably avoided, as it consumes bandwidth. Accordingly, the random selection of copysets should be biased toward selecting copysets of machines having more available storage capacity. In some embodiments, two different copysets are randomly selected as candidate copysets for a new data chunk, one of the two copysets is identified as having the greatest amount of minimum free space of any machines in the copyset, and the identified copyset is assigned to store the data chunk. Alternatively, the identified copyset is the copyset which minimizes the number of machines whose used storage is above a certain threshold of total capacity.

The above process incorporates the use of "fresh" machines, which are introduced empty into the cluster either because they previously failed and were restored or as replacements for failed machines. However, depending on the rate at which data is generated, the introduction might not be fast enough to efficiently use the new capacity. In this case, background load balancing may be used to increase the rate at which data is moved from fuller machines to emptier ones. It may be desirable to limit the rate at which such background load balancing takes place, to avoid using bandwidth which is more preferably allotted to tasks such as serving client requests.

Fresh machines may exhibit a high correlated risk of failure because all fresh machines may come from a homogenous pool and/or because fresh machines use hardware from crashed and refurbished machines that is more likely to fail in the future. Accordingly, preferential placement of data on fresh machines which are likelier to crash simultaneously may increase the risk of data unavailability. If this risk is determined to be unsatisfactory, then sampling bias for load-balancing purposes may be eliminated entirely in favor of background load balancing.

Figure 14:
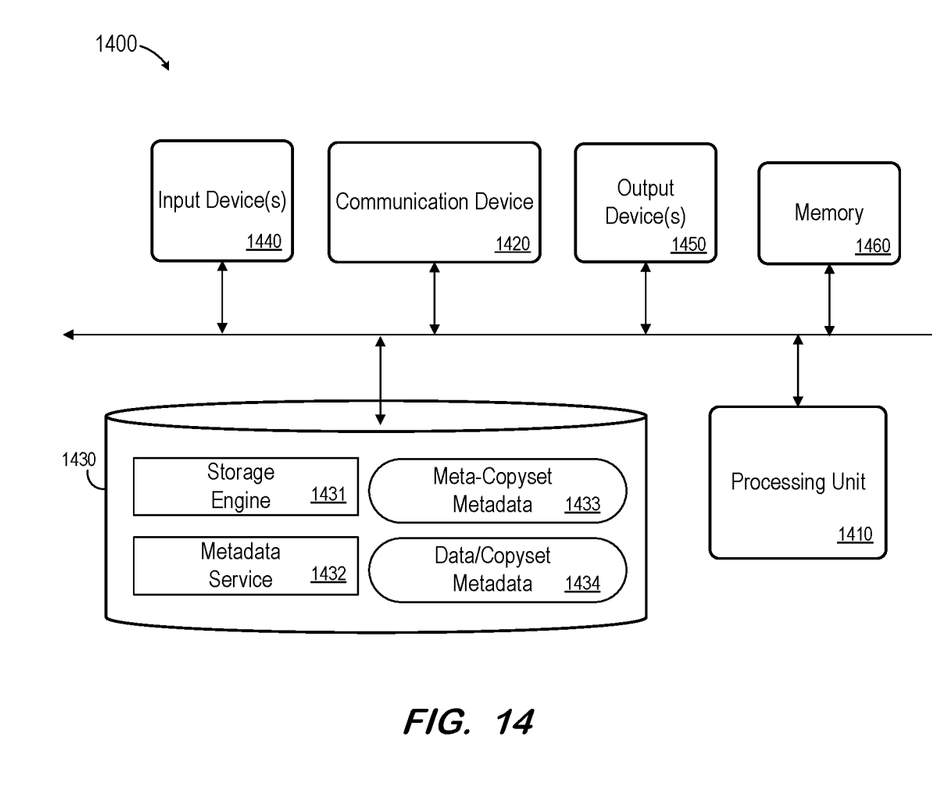
FIG. 14 illustrates a computing device to facilitate data storage according to some embodiments.

FIG. 14 is a block diagram of system 1400 according to some embodiments. System 1400 may comprise a general-purpose computer server and may execute program code to perform any of the processes described herein. Any one or more components of system 1400 may be implemented in a distributed architecture. System 1400 may include other unshown elements according to some embodiments.

System 1400 includes processing unit 1410 operatively coupled to communication device 1420, persistent data storage system 1430, one or more input devices 1440, one or more output devices 1450 and volatile memory 1460. Processing unit 1410 may comprise one or more processors, processing cores, etc. for executing program code. Communication device 1420 may facilitate communication with external devices, such as an external network of storage devices (i.e., machines) and of client devices requiring data storage services. Input device(s) 1440 may comprise, for example, a keyboard, a keypad, a mouse or other pointing device, a microphone, a touch screen, and/or an eye-tracking device. Output device(s) 1450 may comprise, for example, a display (e.g., a display screen), a speaker, and/or a printer.

Data storage system 1430 may comprise any number of appropriate persistent storage devices, including combinations of magnetic storage devices (e.g., magnetic tape, hard disk drives and flash memory), optical storage devices, Read Only Memory (ROM) devices, etc. Memory 1460 may comprise Random Access Memory (RAM), Storage Class Memory (SCM) or any other fast-access memory.

Storage engine 1431 and metadata service 1432 may comprise program code executed by processing unit 1410 to cause system 1400 to perform any one or more of the processes described herein. For example, storage engine 1431 may control the storage of data in and retrieval of data from a plurality of storage devices. Metadata service 1432 may determine storage devices in which data is to be stored and/or migrated. These determinations may be based on meta-copyset data 1433 and data/copyset metadata 1434 as described herein. Data storage device 1430 may also store data and other program code for providing additional functionality and/or which are necessary for operation of system 1400, such as device drivers, operating system files, etc.

Each functional component described herein may be implemented in computer hardware (integrated and/or discrete circuit components), in program code and/or in one or more computing systems executing such program code as is known in the art. Such a computing system may include one or more processing units which execute processor-executable program code stored in a memory system.

The above-described diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions.

Embodiments described herein are solely for the purpose of illustration. Those in the art will recognize other embodiments may be practiced with modifications and alterations to that described above.

What is claimed is:

1. An apparatus comprising:
a memory storing processor-executable process steps;
one or more processors to execute the processor-executable process steps to cause the apparatus to:
determine a plurality of meta-copysets of a plurality of storage devices, each of the meta-copysets including a first set of a first number of storage devices;
determine a first copyset including a second number of storage devices from a first one of the meta-copysets, where the second number is smaller than the first number;
store first data in a fault-tolerant format using the first copyset;
determine to migrate the first data from a first storage device of the first copyset; and
in response to the determination to migrate the first data:
determine a second copyset of the second number of storage devices including a storage device from the first meta-copyset which is not in the first copyset, and the storage devices of the first copyset except for the first storage device of the first copyset; and
store the first data in a fault-tolerant format using the second copyset.

2. An apparatus according to claim 1, wherein storage of the first data in a fault-tolerant format using the first copyset comprises replicating the first data on each storage device of the first copyset, and
wherein storage of the first data in a fault-tolerant format using the second copyset comprises replicating the first data on a storage device from the first meta-copyset which is not in the first copyset.

3. An apparatus according to claim 1, wherein storage of the first data in a fault-tolerant format using the first copyset comprises erasure-coding the first data to generate the second number of fragments associated with the first data and storing each of the second number of fragments on a respective storage device of the first copyset, and
wherein storage of the first data in a fault-tolerant format using the second copyset comprises regenerating the fragment associated with the first data and stored on the first storage device, and storing the regenerated fragment on the storage device from the first meta-copyset which is not in the first copyset.

4. An apparatus according to claim 3, wherein each of the plurality of storage devices is associated with a failure domain shared with one or more other of the plurality of storage devices, wherein storing the regenerated fragment on the storage device from the first meta-copyset which is not in the first copyset comprises:

identification that the storage device from the first meta-copyset which is not in the first copyset is associated with a same failure domain as another storage device of the first copyset; and determination that the regenerated fragment and a fragment associated with the first data and stored on the another storage device of the first copyset are compatible with storage in a same failure domain.

5. An apparatus according to claim 1, wherein each of the plurality of storage devices is associated with a failure domain shared with one or more other of the plurality of storage devices, and wherein determination of the plurality of meta-copysets comprises:

random permutation of the failure domains;

random permutation of the storage devices associated with each of the failure domains;

merging of the permutations into a list, the list sorted primarily by position of each storage device in the permutation of storage devices in a same failure domain, and secondarily by position of a storage device's failure domain in the permutation of failure domains; and separation of the list into two or more groups of the first number of storage devices, where each group is one of the plurality of meta-copysets.

6. An apparatus according to claim 1, the one or more processors to execute the processor-executable process steps to cause the apparatus to:

determine to migrate second data from the first storage device of the first copyset; and in response to the determination to migrate the second data:

determine that no copyset of the second number of storage devices from the first meta-copyset is available; and in response to the determination that no copyset of the second number of storage devices from the first meta-copyset is available, store the second data in a fault-tolerant format using a random copyset of the second number of storage devices of the plurality of storage devices.

7. An apparatus according to claim 1, wherein determination of the first copyset of the second number of storage devices from the first one of the meta-copysets comprises:

determination of the first copyset of the second number of storage devices from the first one of the meta-copysets;

determination of a second candidate copyset of the second number of storage devices from a second one of the meta-copysets;

determination of the free storage capacity of the first copyset and the free storage capacity of the second candidate copyset; and determination of the first copyset of the second number of storage devices based on the free storage capacity of the first copyset and the free storage capacity of the second candidate copyset.

8. An apparatus according to claim 1, the one or more processors to execute the processor-executable process steps to cause the apparatus to:

determine a third copyset from a second meta-copyset of the plurality of storage devices;

store third data in a fault-tolerant format using the third copyset;

determine to migrate the third data from a first storage device of the third copyset; and in response to the determination to migrate the third data:

determine a fourth copyset of the second number of storage devices including a storage device from the second meta-copyset which is not in the third copyset, and the storage devices of the third copyset except for the first storage device of the third copyset; and store the first data in a fault-tolerant format using the fourth copyset.

9. A system comprising:

a plurality of storage devices; and a server to store data to the plurality of storage devices, the server to:

determine a plurality of first sets of storage devices, each of the first sets including a first number of storage devices;

receive first data to store;

determine a first subset of a second number of storage devices from a first one of the first sets of storage devices, where the second number is less than the first number;

store the first data in a fault-tolerant format using the first subset of the second number of storage devices;

determine to replace a first storage device of the first subset of the second number of storage devices; and in response to the determination to replace the first storage device:

determine a replacement storage device from the first one of the first sets of storage devices, where the first subset of the second number of storage devices does not include the replacement storage device; and store the first data in a fault-tolerant format using the replacement storage device and the first subset of the second number of storage devices not including the first storage device.

10. A system according to claim 9, wherein storage of the first data in a fault-tolerant format using the first subset of the second number of storage devices comprises replicating the first data on each of the first subset of the second number of storage devices, and wherein storage of the first data in a fault-tolerant format using the replacement storage device and the first subset of the second number of storage devices not including the first storage device comprises replicating the first data on the replacement storage device.

11. A system according to claim 9, wherein storage of the first data in a fault-tolerant format using the first subset of the second number of storage devices comprises erasure-coding the first data to generate the second number of fragments associated with the first data and storing each of the the second number of fragments on a respective one of the first subset of the second number of storage devices, and wherein storage of the first data in a fault-tolerant format using the replacement storage device and the first subset of the second number of storage devices not including the first storage device comprises regenerating the fragment associated with the first data and stored on the first storage device, and storing the regenerated fragment on the replacement storage device.

12. A system according to claim 11, wherein each of the plurality of storage devices is associated with a failure domain shared with one or more other of the plurality of storage devices, wherein storing the regenerated fragment on the replacement storage device comprises:

identification that the replacement storage device is associated with a same failure domain as another storage device of the first subset; and determination that the regenerated fragment and a fragment associated with the first data and stored on the another storage device of the first subset are compatible with storage in a same failure domain.

13. A system according to claim 9, wherein the determination to replace a first storage device comprises a determination that the first storage device is unavailable.

14. A system according to claim 9, wherein each of the plurality of storage devices is associated with a failure domain shared with one or more other of the plurality of storage devices, and wherein determination of the plurality of first sets of the first number of storage devices comprises:
random permutation of the failure domains;
random permutation of the storage devices associated with each of the failure domains;
merging of the permutations into a list, the list sorted primarily by position of each storage device in the permutation of storage devices in a same failure domain, and secondarily by position of a storage device's failure domain in the permutation of failure domains; and
separation of the list into two or more groups of the first number of storage devices, where each group is one of the plurality of first sets of the first number of storage devices.

15. A system according to claim 9, wherein determination of the first subset from the first one of the first sets of the first number of storage devices comprises:
determination of the first subset from the first one of the first sets of the first number of storage devices;
determination of a second candidate subset of the second number of storage devices from a second one of the first sets of the first number of storage devices;
determination of the free storage capacity of the first subset and the free storage capacity of the second candidate subset; and
determination of the first subset of the first second of storage devices based on the free storage capacity of the first subset and the free storage capacity of the second candidate subset.

16. A system according to claim 9, the server further to:
receive third data to store;
determine a third subset of the second number of storage devices from a second one of the first sets of storage devices;
store the third data in a fault-tolerant format using the third subset of the second number of storage devices;
determine to replace a first storage device of the third subset of the second number of storage devices; and
in response to the determination to replace the first storage device of the third subset of the second number of storage devices:
determine a third replacement storage device from the second one of the first sets of storage devices, where the third subset of the second number of storage devices does not include the third replacement storage device; and
store the third data in a fault-tolerant format using the third replacement storage device and the third subset of the second number of storage devices not including the first storage device of the third subset of the second number of storage devices.

17. A method to store data in a fault tolerant format among a plurality of storage devices, the method comprising:
determining a plurality of first sets of storage devices, each of the first sets including a first number of storage devices;
receiving first data to store;
determining a first subset of a second number of storage devices from a first one of the first sets of storage devices, where the second number is less than the first number;
storing the first data in a fault-tolerant format using the first subset of the second number of storage devices;
determining to replace a first storage device of the first subset of the second number of storage devices; and
in response to determining to replace the first storage device:
determining a replacement storage device from the first one of the first sets of storage devices, where the first subset of the second number of storage devices does not include the replacement storage device; and
storing the first data in a fault-tolerant format using the replacement storage device and the first subset of the second number of storage devices not including the first storage device.

18. A method according to claim 17, wherein storing the first data in a fault-tolerant format using the first subset of the second number of storage devices comprises replicating the first data on each of the first subset of the second number of storage devices, and
wherein storing the first data in a fault-tolerant format using the replacement storage device and the first subset of the second number of storage devices not including the first storage device comprises replicating the first data on the replacement storage device.

19. A method according to claim 17, wherein storing the first data in a fault-tolerant format using the first subset of the second number of storage devices comprises erasure-coding the first data to generate the second number of fragments associated with the first data and storing each of the second number of fragments on a respective one of the first subset of the second number of storage devices, and
wherein storing the first data in a fault-tolerant format using the replacement storage device and the first subset of the second number of storage devices not including the first storage device comprises regenerating the fragment associated with the first data and stored on the first storage device, and storing the regenerated fragment on the replacement storage device.

20. A method according to claim 16, further comprising:
receiving second data to store;
determining a second subset of the second number of storage devices from the first one of the first sets of storage devices;
storing the second data in a fault-tolerant format using the second subset of the second number of storage devices;
determining to replace a first storage device of the second subset of the second number of storage devices; and
in response to determining to replace the first storage device of the second subset of the second number of storage devices:
determining a second replacement storage device from the first one of the first sets of storage devices, where the second subset of the second number of storage devices does not include the second replacement storage device; and
storing the second data in a fault-tolerant format using the second replacement storage device and the second subset of the second number of storage devices not including the first storage device of the second subset of the second number of storage devices.

* * * * *